United States Patent
Hickman et al.

[11] 3,988,535
[45] Oct. 26, 1976

[54] AUTOMATED POSITIONING

[75] Inventors: Henry H. Hickman, Woodridge; Avinash R. Kalke, Lisle; Walter Lach, La Grange Park; Ronald F. Myscofski, Lisle, all of Ill.

[73] Assignee: Western Electric Company, Inc., New York, N.Y.

[22] Filed: Nov. 4, 1975

[21] Appl. No.: 628,729

[52] U.S. Cl. .......................... 178/6.8; 178/DIG. 1; 178/DIG. 38; 178/DIG. 36
[51] Int. Cl.² ........................................... H04N 7/18
[58] Field of Search ............... 178/DIG. 1, DIG. 38, 178/6.8, DIG. 36, DIG. 21

[56] References Cited
UNITED STATES PATENTS

| | | | |
|---|---|---|---|
| 3,207,904 | 9/1965 | Heinz | 250/202 |
| 3,562,423 | 2/1971 | Murphy | 178/6.8 |
| 3,581,375 | 6/1971 | Rottmann | 29/407 |
| 3,814,845 | 6/1974 | Hurlbrink | 178/6.8 |
| 3,834,819 | 9/1974 | Montone | 356/156 |
| 3,899,634 | 8/1975 | Montone | 178/6.8 |
| 3,903,363 | 9/1975 | Montone | 178/6.8 |

*Primary Examiner*—Robert L. Griffin
*Assistant Examiner*—Edward L. Coles
*Attorney, Agent, or Firm*—W. G. Dosse; W. P. Miller

[57] ABSTRACT

Beam-lead chips are held to a magnetic carrier and incident light reflected by the shiny beam leads is seen by a TV camera. The electronic image is normalized and insignificant reflections are ignored. An X-Y table moves the magnetic carrier to bring the next chip within the field of view of the camera. The table then moves the carrier in two dimensions while seeking the reflections of specific beam leads. The locations of the edges of the desired beam leads are noted, and the X-Y table quickly moves to its final position midway between the noted edges. A subtraction of the X and Y data results in a $\theta$ correction signal. The chip is then vacuum lifted from the magnetic carrier by a prior art bonding head. Meanwhile, a substrate has been similarly positioned using another TV camera. The bonding head moves the chip to the substrate and bonds the beam leads.

8 Claims, 8 Drawing Figures

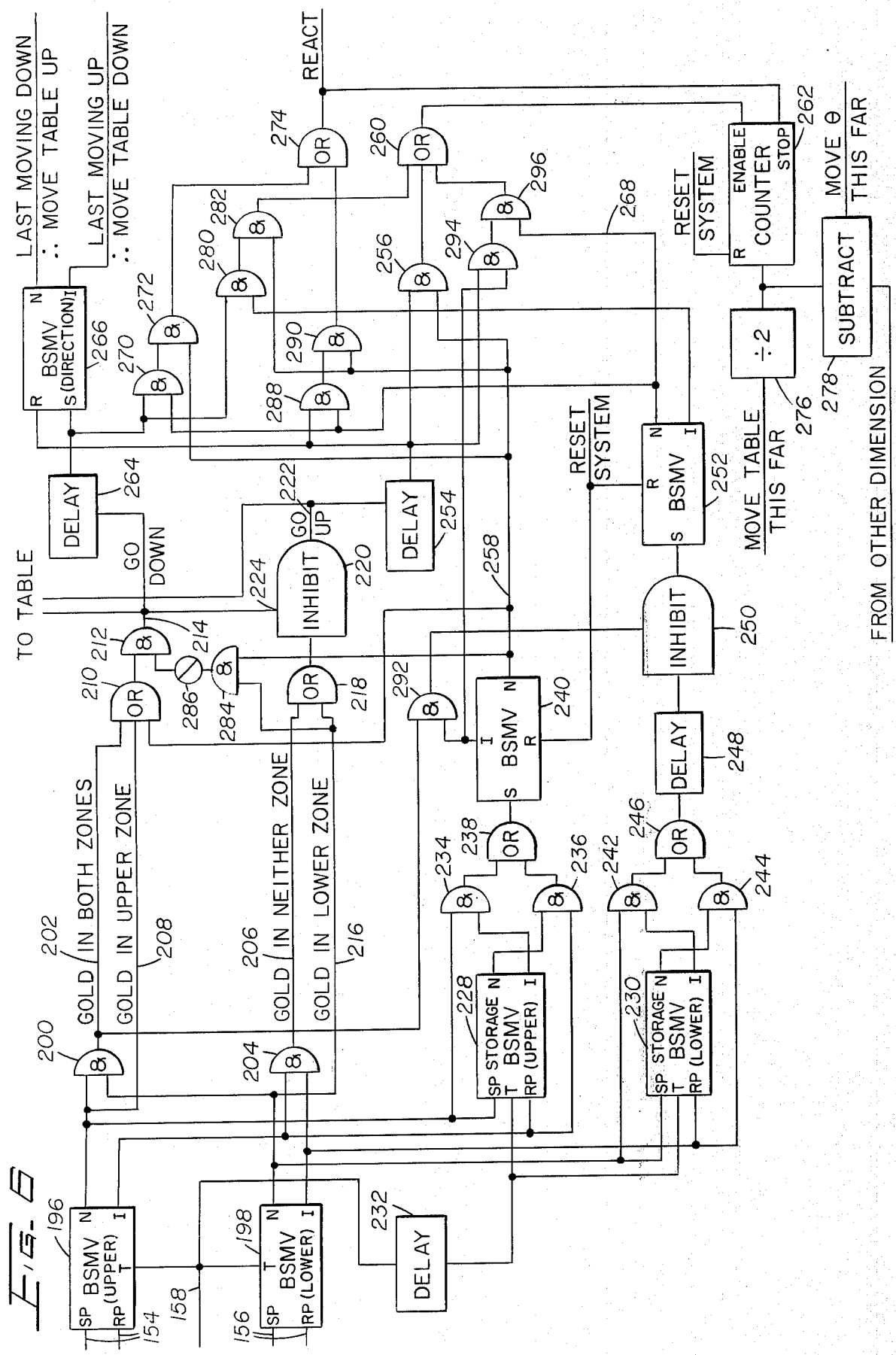

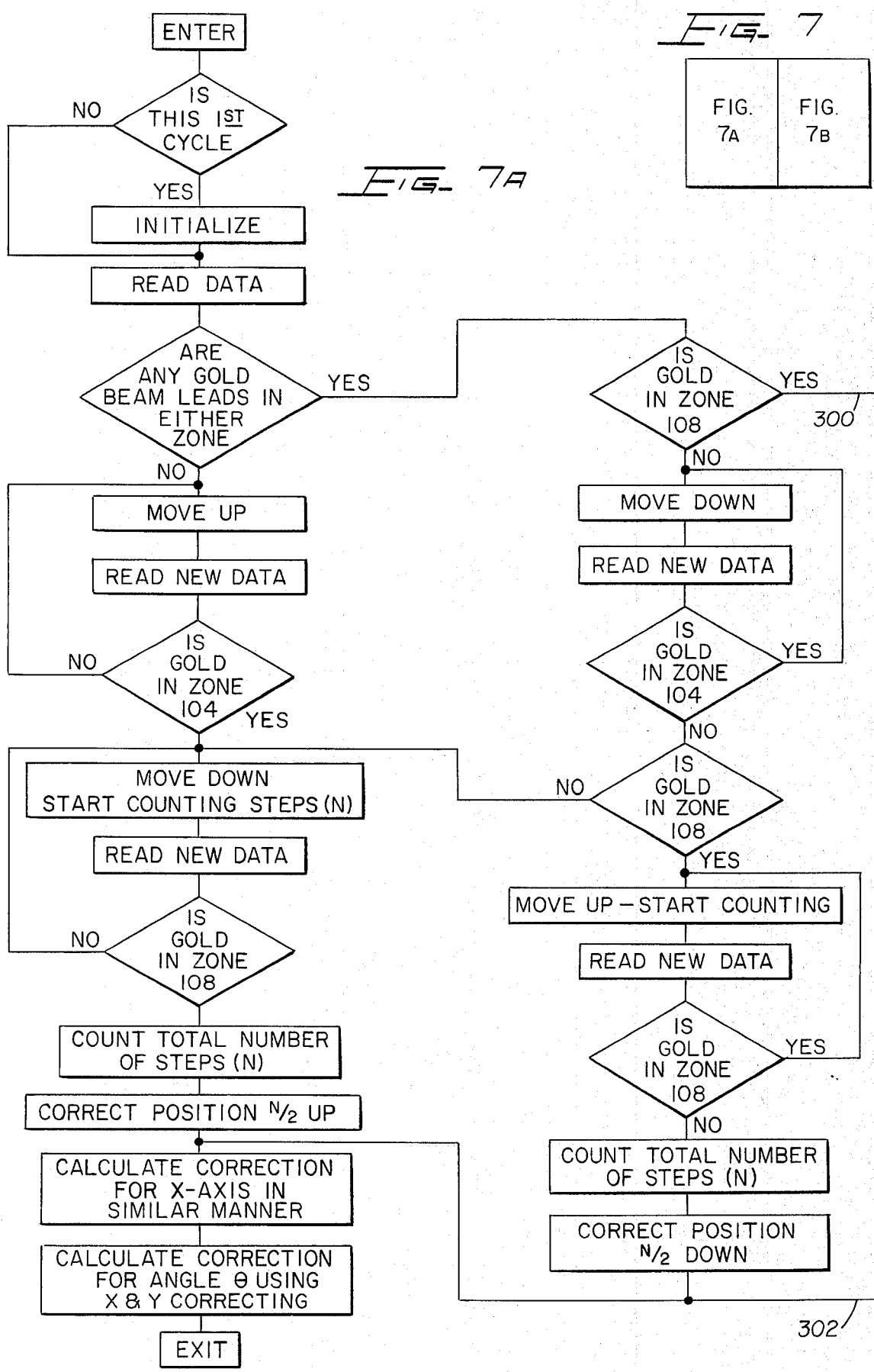

AUTOMATED POSITIONING

FIELD OF THE INVENTION

The present invention relates to automatic positioning and more specifically to precision positioning of an article by relatively moving the image of the article and reference zones in at least one dimension to locate at least one prominent feature of the article with respect to the reference zones and then positioning the article between the two locations at which the prominent feature representations were noted with respect to the two reference zones.

BACKGROUND OF THE INVENTION

In the manufacture of ever more miniaturized, complex and compact electronic circuits; the art has developed to hybrid integrated circuits in which many conventional integrated circuit chips are mounted on substrates much like resistors were previously mounted on printed wiring boards. One of the more promising techniques for utilizing these hybrid integrated circuits involves the use of a ceramic substrate with gold conductors defining a plurality of bond sites to which integrated circuits are bonded.

The integrated circuits or chips; which are typically thin dies of silicon on which entire, multi-transistor circuits are formed; are typically on the order of 2mm by 2mm squares less than a millimeter thick. The areas on the chip to which connections are made to the external circuit are attached to cantilevered gold beams which extend outwardly from the edges of the chip. These chips are either painted with magnetic ink and mounted in rows and columns in an orthogonal array on a magnetic carrier, or they can be applied to an adhesive carrier. The mounting of a chip on the carrier can be accomplished with moderate accuracy as to X and Y coordinates as well as to rotation ($\theta$). But the chips cannot be positioned on the carrier with the degree of accuracy required for pick-up by a bonding head and transfer to a bond site on the substrate, without some additional fine positioning.

Manual fine positioning is now typically done by an operator peering through a microscope at an optical beam splitter to superimpose an image of the beam-leaded chip upon an image of the welding or bonding tool which is also the chip pick-up tool. When these images are aligned, the optical beam splitter is retracted and the bonding tool is lowered. By means of a vacuum, the tool picks the chip from the carrier. The bond site on the substrate is then positioned under the bonding tool and chip using the same optical beam splitter. When alignment is assured, the tool descends and bonds the beam leads of the chip to suitable gold pads at the bond site on the ceramic substrate.

This manual technique of positioning the chip and the bond site is tedious, exacting, and expensive. Semiautomatic techniques have been developed in which the carrier is automatically indexed by a digital-controlled machine to position the next succeeding chip within the field of the operator's microscope. The same type of digital-controlled machine can be place next suitable bond site under the operator's microscope for bonding. This type of semi-automatic machine is of great assistance to the operator as the human operator need only perform the critical operation of fine positioning of both the chip and the substrate. These digital-controlled operations are direct analogies to those which have been used for the past decade or two in the field of automated machine tools.

Further efforts have been made to reduce the cost and human error which are part of the manual fine positioning of chips and bond sites. Several systems have been deviced to sense the location of the beam leads of the chip and also the pads of the bond site. These systems typically generate an error signal which is then used for fine correction of the position of the chip or the bond site.

One such system has been marketed by Precision Equipment Company, Inc., a subsidiary of Kulick and Soffa, Inc. and involves viewing the substrate or the bond site with a TV camera and projecting a magnified image of the chip or bond site onto the vidicon target of the TV camera. As opposed to the orthogonal raster of the conventional TV picture, a circular scan of fixed diameter is moved about the target; and the resultant video signal is compared with a stored representation of the video signal derived previously from a properly positioned chip or bond site. When a match is noted between the two signals, an error signal in three dimensions is generated; and the location of the bond site or chip is corrected in the X, Y, and $\theta$ dimensions.

It is also known that a typical raster scan of the vidicon target can be similarly compared with a stored representation of a properly positioned chip for generating error signals. The transition from dark to light image resulting from the scanning of the video beam as it crosses an edge of a gold reflection can be used to determine the locations of the highly reflective gold beam leads of the chip or the highly reflective bonding pads of the substrate.

SUMMARY OF THE INVENTION

In accordance with the present invention, an article having at least one prominent feature is positioned by generating a video signal of the article including prominent features, generating a video signal representing a first position marker and a second position marker, relatively moving the video signals representing the article and the video signals representing the position marker until there is coincidence between a prominent feature and one of the position markers, relatively moving the video signal representing the article and the video signals representing the position markers and noting the movement necessary to cause coincidence of a prominent feature with a second position marker, and moving the article by an amount proportional to one-half of the relative movement between coincidences.

BRIEF DESCRIPTION OF THE DRAWINGS

A more complete understanding of the present invention may be had by referring to the following detailed description when considered in conjunction with the accompanying drawings wherein like reference numbers refer to the same or similar parts throughout the several views:

FIG. 6 is a logic block diagram of a system in wired form for implementing the present invention; and FIGS. 7A and 7B, arranged to the right of FIG. 7A, are a flow diagram of a stored program logic system for implementing the present invention.

DETAILED DESCRIPTION

Figure 1:
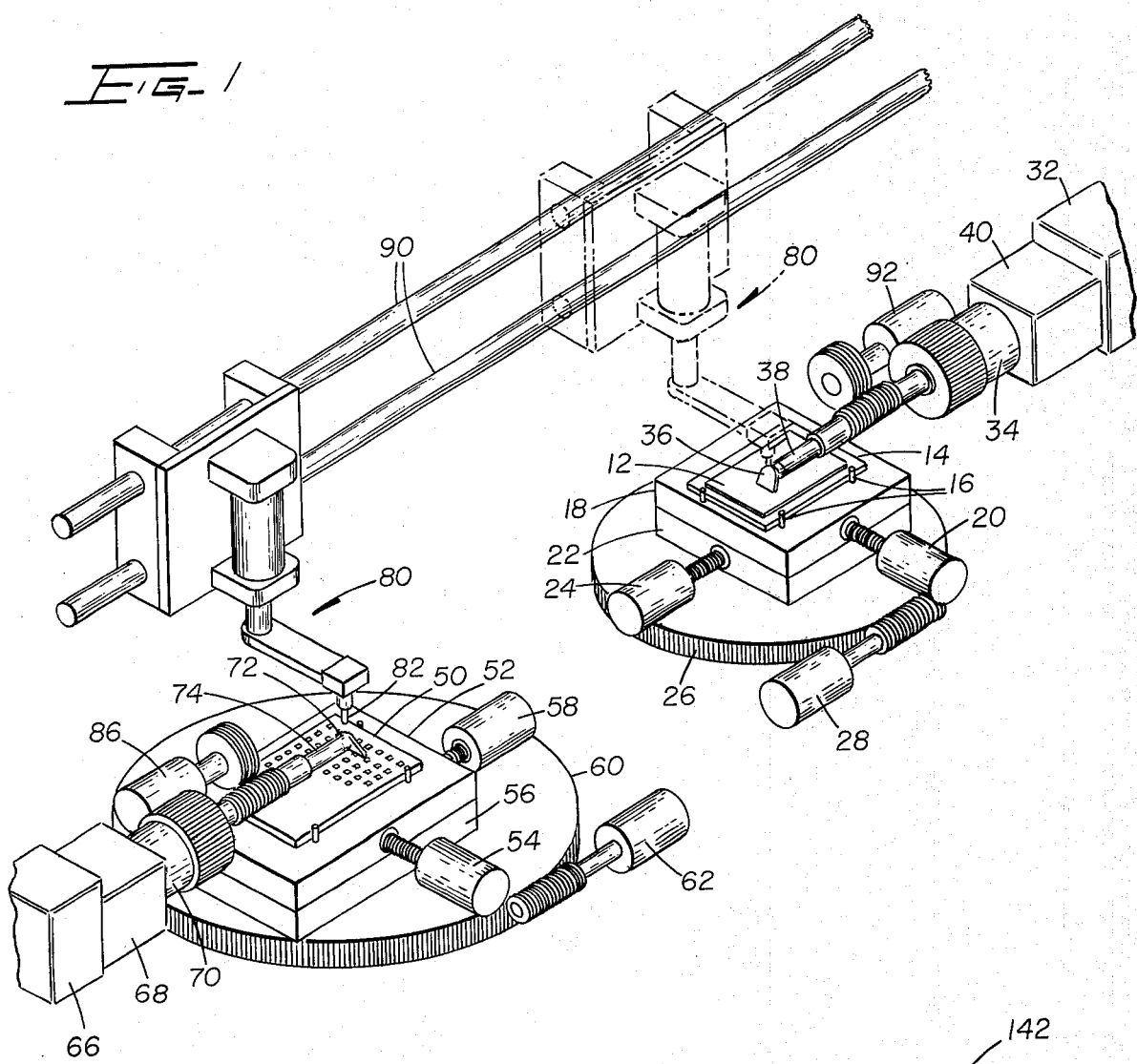
FIG. 1 is a schematic diagram of a bonding and positioning mechanism controlled in accordance with the present invention.
Figure 3:
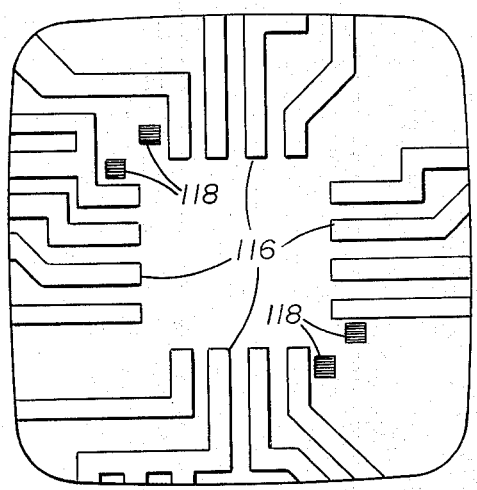

Referring now to the drawings and more particularly to FIG. 1, a ceramic substrate 12 having printed circuitry in the form of gold conductors on the surface thereof, including a plurality of bond sites, as respresented typically in FIG. 3, is mounted in a carrier fixture 14. The substrate 12 has previously been properly aligned in the fixture 14, using alignment markers in the pattern and fixed alignment markers in the fixture 14, in accordance with the prior art. The fixture 14 is then accurately positioned in a mating fixture represented by locating pins 16 on top of a positioning table 18. A servo motor 20 drives the table 18 in one dimension on top of an orthogonal positioning table 22 which is moved by a servo motor 24 in a dimension perpendicular to the movement of the table 18 by the motor 20. The tables 18 and 22, with their servo motors 20 and 24, comprises an X, Y positioner well known in the prior art.

The servo motor 24 moves the table 22 across the top of a rotational or $\theta$ table 26 which is rotated about its center by a servo motor 28. A TV camera 32 is arranged with a light source 34 to cooperate with a fiber-optic system from the light source 34 to a mirror head 36 where the fiber-optic system from the light source 34 carries the light inside of a shaft 38. The light shines on the substrate from several angles in that area of the substrate which is aligned with the axis of rotation of the $\theta$ table 26.

A 45° angle mirror in the mirror head 36 combines with a lens system referred to schematically by reference numeral 40 to project a magnified image of the illuminated substrate area onto the vidicon target in the camera 32.

Figure 2:
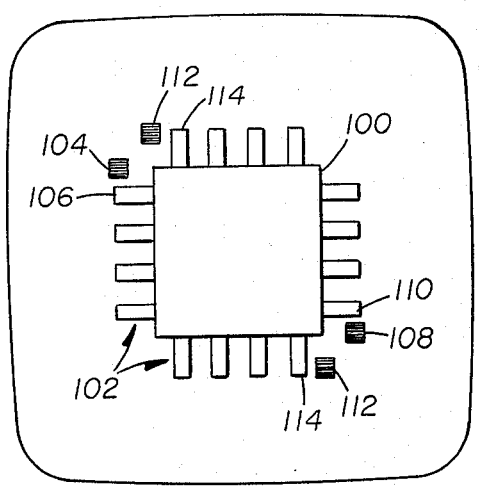
FIGS. 2 and 3 are representations of a video image of a beam lead integrated circuit and a bond site on a substrate, respectively, each showing two pairs of position markers.

Using prior art digital control techniques, using a digital tape, a template, or a stored program in a minicomputer, the substrate is roughly positioned to bring a bond site to a bonding position beneath the mirror head 36. A beam lead device of the general outline depicted in FIG. 2 is to be deposited on the bond site for bonding of the beam leads to the pads on the bond site, preferably by thermocompression bonding, a form of spot welding.

The prior art system for roughly positioning the substrate does not contain sufficient precision to locate the pads of the bond site in the exact position required, due to the microminiature sizes involved. However, prior art positioning devices are fully capable of positioning the substrate so that the appropriate bond site is within the field of the camera 32 for fine positioning in accordance with the present invention, which will be described in detail hereinafter. While a $\theta$ table has been shown for positioning the substrate 12, $\theta$ positioning of the substrate 12 within the fixture 14 and on the table 18 may be sufficiently accurate to obviate the $\theta$ table 26.

In an approximate duplication of the positioning system for the substrate 12, a magnetic or adhesive carrier 50 containing an orthogonal array of as many as 400 beam leaded devices or chips is placed on a movable table 52. The table 52 is controlled to move in one dimension by a servo motor 54. The table 52, in turn rides on an orthogonal table 56. The table 56 is moved by a servo motor 58 with respect to a $\theta$ table 60 which is moved rotationally by a servo motor 62. A TV camera 66 with a lens system 68 and a light source 70 cooperates with a mirror head 72 to shine light through a fiber-optic system contained in a shaft 74 to illuminate the beam leaded chip positioned in line with the axis of rotation of the $\theta$ table 60.

Using prior art techniques, the beam leaded chips are mounted with reasonable accuracy in the rows and columns of the carrier 50. Digital control systems according to the prior art are capable of roughly positioning successive chips under the mirror head 72. However, due to mounting variations on the carrier 50, it is difficult, if not impossible, to position the beam leaded chips with sufficient precision for immediate pick-up, transfer, and bonding by a bonding mechanism 80. The mechanism 80 is also arranged to have its bonding head 82 directly in line with the axis of rotation of the $\theta$ table 60.

In the operation of the device depicted in FIG. 1, the next succeeding chip on the carrier 50 is positioned under the mirror head 72. The image of the chip with its beam leads is projected onto the target of the vidicon within the TV camera 66. The vidicon target is conventionally traced with an orthogonal raster; and the X, Y and $\theta$ tables are adjusted in accordance with the present invention, as will be explained in detail hereinafter, so as to align the desired beam leaded chip directly under the bonding head 82. The TV image of the chip is characterized by reflections of high light intensity produced by the shiny beam leads projecting outward from the chip.

When fine positioning of the chip has been accomplished, a servo motor 86 is energized to withdraw the shaft 74 and the mirror head 72. The bonding mechanism 80 lowers the bonding head 82 and uses a vacuum to pick up the desired chip in accordance with the prior art. When the bonding head 82 is raised, carrying the beam leaded chip by means of the vacuum, the bonding mechanism moves on a pair of traversing rods 90 from the position shown in solid lines in FIG. 1 to the position shown in dotted lines in FIG. 1. The movement of the bonding mechanism between the two positions indicated in FIG. 1 can be controlled with a very high degree of precision.

Meanwhile, the mirror head 36 and the shaft 38 are retracted by means of a servo motor 92 to make room over the bond site for the bonding head 82. The bonding head 82 is positioned over the accurately-located bond site on the substrate 12. The bonding head 82 then descends, bonding the beam leads to the pads of the bond site using a modest force and a suitable amount of heat in accordance with the prior art.

VIDEO IMAGES

Referring now to FIGS. 2 and 3, there are depicted the video images of a typical beam leaded chip and a typical bond site, respectively. These images are as they are seen by the TV cameras 66 and 32, respectively. They are shown in a configuration as they appear on a pair of TV monitors that are preferably used to monitor the operation of the present bonding machine. Referring specifically to FIG. 2, the chip 100 has a plurality of beam leads 102 projecting from its sides. These beam leads are firmly fixed to the circuit of the chip 100 and are merely cantilevered outward from the chip. Superimposed upon the video image of the chip are two pairs of position marker zones. The upper position marker zone 104 is arranged near a beam lead 106. Therefore, movement of the chip 100 in the upward direction, as depicted in FIG. 2, causes the beam lead 106 to coincide with the upper position marker zone 104. Similarly, a lower position marker zone 108 is arranged to cooperate with a beam lead 110. Therefore, when the chip 100 moves downwardly, as depicted in FIG. 2, the image of the beam lead 110 eventually coincides with the lower position marker zone 108. A pair of position marker zones 112 are arranged to cooperate with adjacent beam leads 114 to detect coincidence as the chip 100 is moved from left to right and from right to left, as depicted in FIG. 2.

Referring now to FIG. 3, it can be seen that pads 116 at the bond site are analogous to the beam leads 102 of the chip 100 in that they are shiny and highly reflective when sensed by the TV camera 32 of FIG. 1. Two pairs of position markers 118 are arranged to cooperate with the pads 116 to aid in positioning of the bond site depicted in FIG. 3 in a manner identical to that used to position the chip 100, with the exception that fine $\theta$ or rotational positioning of the substrate 12 may not be necessary.

While the position markers depicted in FIGS. 2 and 3 appear to be a part of the video image, they are not, in fact, seen by the cameras 32 and 66 but are generated electronically

POSITION MARKER GENERATOR AND COINCIDENCE DETECTOR

Figure 4:
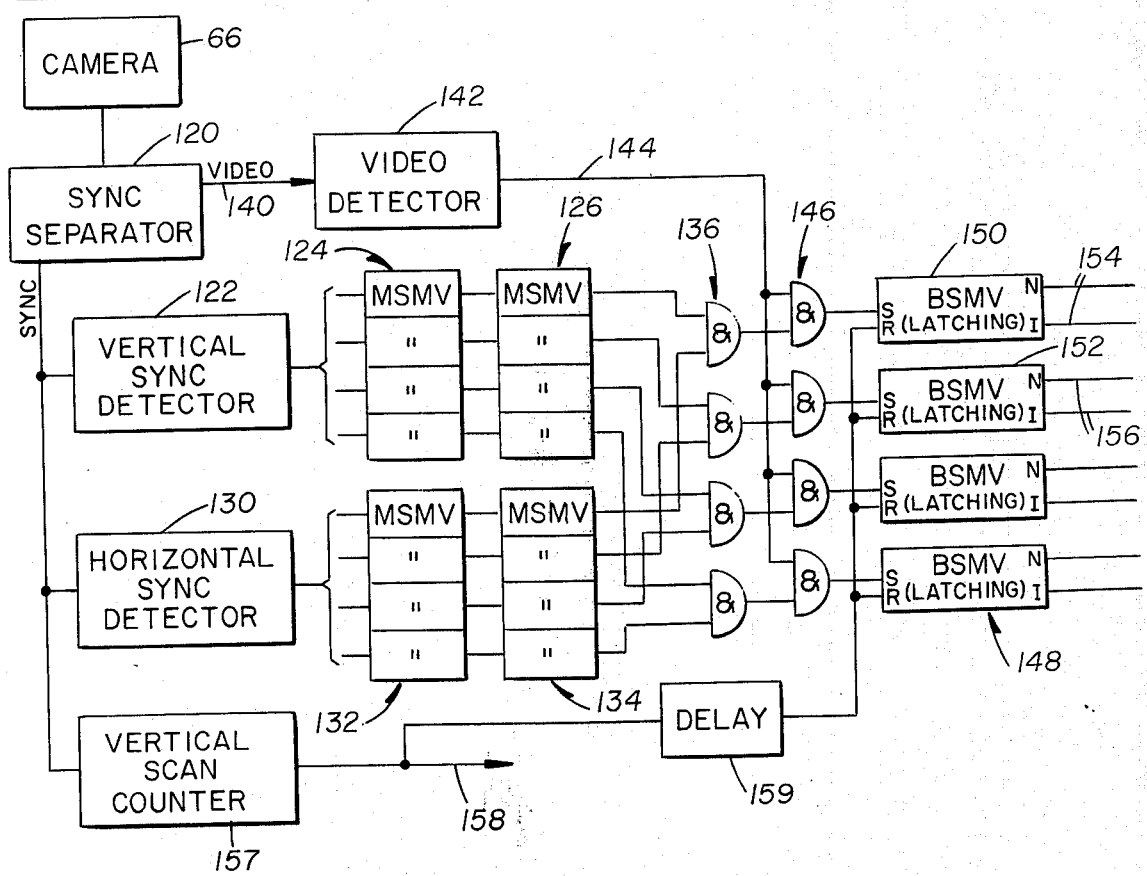
FIG. 4 is a schematic logic diagram of a system for generating the position markers.

Since fine positioning of the chip is essentially identical to fine positioning of the substrate, with the possible exception of $\theta$ or rotational positioning, only chip positioning is described in detail. Referring now to FIG. 4, the output from the TV camera 66 is in the form easily recognized by one skilled in the television art. The brightness or video data signals appear in one polarity and the blanking and synchronizing (SYNC) signals appear in the other polarity. The video output from the camera 66 is split in a SYNC separator 120 into the video data signals and the synchronizing signals. The synchronizing signals include the vertical synchronizing signals as well as the horizontal or sweep synchronizing signals.

At the start of each raster scan, the cathode ray beam (for example) of a TV monitor starts at the upper left hand corner of the screen and proceeds rapidly from left to right. After completing one horizontal sweep, the beam begins again at the left edge of the screen but somewhat lower and again sweeps from left to right. The horizontal and vertical scanning of the TV image is essentially a superimposed saw tooth pattern of very high horizontal sweep frequency and considerably lower vertical sweep frequency.

The start of each vertical sweep is recognized in a vertical SYNC detector 122 which issues a trigger pulse to four vertical delay monostable multivibrators 124 which time the interval in the vertical sweep from the top of the screen to each of the four position markers depicted in FIG. 2. The outputs of the vertical delay monostable multivibrators 124 are then sent to four vertical interval monostable multivibrators 126 which generate a duration represented spatially by the height of each of the position markers of FIG. 2. Therefore, each of the monostable multivibrators 126 is in its quasistable state and issuing an output signal only when the raster is being swept by horizontal lines at a vertical height corresponding to the associated position marker zone.

Each horizontal SYNC pulse is detected by a horizontal SYNC detector 130 which issues an output pulse each time that the beam begins sweeping from left to right. The trigger output from the horizontal SYNC detector 130 is sent to four horizontal delay monostable multivibrators 132 which determine the sweep delay interval between the left margin of the raster to each of the four position marker zones. The outputs from the horizontal delay monostable multivibrator 132 are sent to four horizontal interval monostable multivibrators 134 which determine the horizontal size of each of the four position marker zones. The horizontal size of each positioin marker zone is determined by the duration of its associated monostable multivibrator 134. When one of the monostable multivibrators 134 is in its quasistable state, the beam is at a horizontal positioning corresponding to the horizontal position of the associated position marker zone. Four marker AND-gates 136 are arranged to combine the outputs from the horizontal and vertical interval monostable multivibrators 136 and 134 such that each of the AND-gates 136 issues a signal at its output when the beam is sweeping through the position occupied by its associated position marker zone.

The video information signal contained or carried on a video link 140 is coupled to a video detector 142, the operation of which is described in greater detail in connection with FIG. 5. The output of the video detector is a binary signal wherein the binary 1 state represents a persistent area of high intensity in the video image. The video detector ignores short-duration signals which might be crystal facets in the ceramic substrate or flaws in the chip.

The binary output from the video detector 142 carried on a wire 144 is coupled to four coincidence AND-gates 145. Therefore, when a reflection from a gold beam lead on the chip or a gold pad on the substrate is sensed at the same time as the beam is sweeping through one of the position marker zones, the associated coincidence AND-gate is energized and issues a set signal to an associated one of four latching flip-flops or bistable multivibrators 148. Therefore, each of four bistable multivibrators 148 corresponds to one of the four position marker zones and is set to its binary 1 state whenever an image of reflective gold coincides with its associated position marker.

As an example, of the operation of the fine position system, the upper latching bistable multivibrator 150 of the bistable multivibrators 198 represents the upper vertical position marker zone 104 and the bistable multivibrator 152 represents the lower vertical position marker 108 of FIG. 2. Therefore, whenever in the movement of the chip 100, the beam lead 106 coincides with the upper position marker zone 104, the upper latching bistable multivibrator 150 is set to its 1 state and delivers a 1 output signal at an upper output wire 154. Actually, the wire 154 is a conjugate pair. When the bistable multivibrator 154 is in its 0 state, its normal output (N) issues a binary 0 and its inverted output (I) issues a binary 1. Conversely, when the bistable multivibrator 154 is in its 1 state, its normal output (N) issues a binary 1 signal and its inverted output (I) issues a binary 0 signal.

When the chip 100 is in a lower position in FIG. 2 and the beam lead 110 coincides with the lower position marker zone 108, the lower latching bistable multivibrator 152 is set to its 1 state and this output is carried on a lower output wire 156 (actually a conjugate pair as in the case of the wire 154).

The other two bistable multivibrators of the four latching bistable multivibrators 148 correspond to the other dimension, that is, to the left-right position marker zones 112 of FIG. 2.

It is possible to have succeeding raster scans trace exactly the same target or image lines. However, this is not customarily done in TV cameras. The sweep lines of successive scans are customarily interleaved such that a sweep line of one raster scan will trace an area between horizontal sweep lines of the preceeding raster scan.

For example, in the ubiquitus, domestic, entertainment TV set, raster scans are displaced vertically by a distance equal to one-half of the spacing between successive horizontal sweeps. Therefore, odd numbered horizontal lines are swept in one raster scan and even numbered horizontal lines are swept in the succeeding raster scan.

The TV cameras 32 and 66 (FIG. 1) preferably use a random interleaving of the scans. It has been found that a virtually complete image may be obtained after seven successive raster scans. Therefore, the output of the flip-flops 148 of FIG. 4 should be sampled only after seven vertical sweeps of the video signal. A vertical scan counter 157 is merely a modulo-seven binary counter and delivers an output on a data-available wire 158 after each seven vertical scans.

The number seven is used in connection with the vertical scan counter 157 because of the random interleaving of the cameras 32 and 66. However, if a typical entertainment TV camera were used having alternate interleaving, the vertical scan counter would be a modulo-two binary counter (a single flip-flop). However, a loss in vertical resolution will occur in this case.

A delay 159 accepts the data-available signal on the wire 158 and resets the latching bistable multivibrators 148. However, the delay 159 assures that the data contained in the latching bistable multivibrators 148 have been sampled as a result of the data-available signal.

VIDEO DETECTOR

Figure 5:
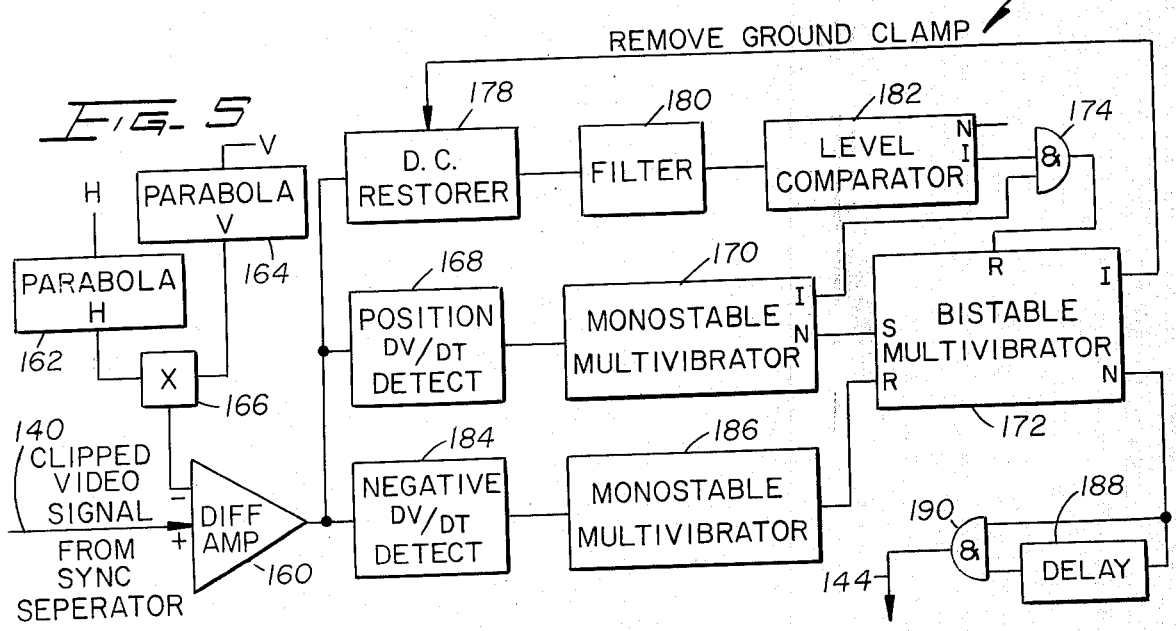
FIG. 5, located on the same sheet as FIG. 1, is a detailed schematic block diagram of the video detector of FIG. 4.

The details of the video detector 142 are shown in FIG. 5. The video link 140 from the SYNC separator 120 of FIG. 4 carries the video signal from the SYNC separator to a differential amplifier 160. The synchronizing pulses have been clipped from the video signal before it is delivered via the video link 140 to the differential amplifier 160.

A video signal from a vidicon device carries an amplitude component that corresponds to the light transmitting efficiency of the lens system used with the TV camera. Such a lens system tends to be more efficient at the center of the image than at the edges of the image. Therefore, an object of constant intensity over its entire surface will be seen by the vidicon tube as having a greater intensity at its center than at its top, bottom and side edges. This is generally a parabolic function which can readily be generated mathematically, and such correction is often built into TV cameras. In order to use a camera of lesser cost, a horizontal parabolic generator 162 and a vertical parabolic generator 164 are connected to the horizontal and vertical SYNC signals, respectively. Their outputs are multiplied at a conventional multiplier 166 and the analog output developed by the multiplier 166 is delivered to the negative input of the differential amplifier 160 in order to roughly normalize the amplitude of the video signal.

The purpose of the video detector 142 is principally to disregard short video brightness signals that may result from facets of ceramic crystals of the substrate or stray reflections from the chip or its carrier. These spurious reflections will typically be considerably shorter in duration than the reflections derived from a gold beam lead or a gold bonding pad at a bond site on the substrate.

The output of the differential amplifier is delivered to three components. A positive transistion ($dv/dt$) detector 168 — which is a simple RC differentiator — triggers a monostable multivibrator 170 each time that a positive transistion of substantial intensity occurs. The normal output of the monostable multivibrator 170 sets a bistable multivibrator 172 to its 1 state, the inverted output of the monostable multivibrator 170 is delivered to an AND-gate 174. Therefore, the AND-gate 174 cannot issue an output signal while the monostable multivibrator 170 is in its quasistable state. The inverted output of the bistable multivibrator 172 is connected to a clamping input of a DC restorer 178. Therefore, when the bistable multivibrator 172 assumes its 1 state its inverted output removes a clamping input from the DC restorer 178, allowing the DC restorer to respond to the video amplifier 160.

The DC restorer 178 is intended to assure that the background of the video signal is substantially at ground voltage or binary 0 magnitude and refers the bright signal from a gold reflection as a positive voltage referenced to this ground voltage. Therefore, the DC restorer 178 essentially completes the normalization of the video signal. The output of the DC restorer passes through a filter 180 which smooths out extreme variations in the video brightness signal reflected from a gold surface. The filter 180 delivers a more or less filtered signal to a level comparator 182 which generates at its normal output a binary output signal that is either a binary 1 output signal if the filtered video signal is above a predetermined magnitude or a binary 0 output signal if the filtered video signal is below that predetermined magnitude. A conventional Schmitt trigger is one example of a circuit that is suitable for use as a level comparator 182.

The inverted output of the level comparator 182 is combined in the AND-gate 174 with the inverted signal from the monostable multivibrator 170. Therefore, if there is no bright video signal at the instant when the monostable multivibrator 170 returns to its stable state, both inverted outputs are binary 1 signals and the AND-gate 174 is energized and resets the bistable multivibrator 172.

However, if there is a bright signal when the monostable multivibrator 174 returns to its stable state, the level comparator delivers an 0 signal from its inverted output and there is no reset signal for the bistable multivibrator 172 until the DC level of the video signal again drops below the predetermined magnitude. When the filtered video signal drops below that predetermined mangitude, the inverted output of the comparator 182 again generates a 1 signal to the AND-gate 174. Since the change is a negative transistion, the inverted output from the monostable multivibrator 170 causes the AND-gate 174 to issue a reset signal for the monostable multivibrator 172.

As an alternative, a negative transistion $(-dv/dt)$ detector 184 recognizes a negative transistion in the video signal and triggers a monostable multivibrator 186 which resets the bistable multivibrator 172.

The output from the bistable multivibrator must not reach the coincidence AND-gates 146 of FIG. 4 in the event of a false intensity signal. Therefore, the normal output of the bistable multivibrator 172 is delivered to a delay 188 whose duration is slightly longer than the quasistable state of the monostable multivibrator 170. The output of the delay 188 and the normal output of the bistable multivibrator 172 are delivered as the two inputs to an AND-gate 190 which slightly delays an output on the wire 144 (FIG. 4) but passes that output only when the bistable miltivibrator remains in the 1 state for a period longer than the duration of the delay 188.

CENTERING LOGIC

Referring now to FIG. 6, the upper output wire 154 from the latching bistable multivibrator 150 is connected to the input of an upper bistable multivibrator 196 in FIG. 6. The wire 154 from the normal output of the latching bistable multivibrator 154 is connected to a set priming (SP) input of the upper bistable multivibrator 196. Similarly, the inverted output of the latching bistable multivibrator 150 is connected to the reset priming (RP) input of the upper bistable multivibrator 196. In this way, the output of the latching bistable multivibrator 150 conditions the input of the upper bistable multivibrator 196 to assume the binary 1 state or the 0 state of the latching bistable multivibrator 150 whenever a trigger pulse is delivered to the trigger input (T) of the upper bistable multivibrator 196.

That trigger input is supplied on the data-available wire 158 from the vertical scan counter 157. Therefore, after every seventh vertical scan of the TV camera, the upper bistable multivibrator 196 is triggered to assume the binary condition of its associated latching bistable multivibrator 150 (FIG. 4). Similarly, the lower output wires 156 from the lower latching bistable multivibrator 152 are connected to the set and reset prime inputs of a lower bistable multivibrator 198 (FIG. 6). Consequently, whenever an image of a reflective gold beam lead coincides with the location in the raster scan of the upper position marker 104 or the lower position marker 108, that fact is registered in the corresponding upper or lower bistable multivibrator 196 or 198.

The normal output of the upper bistable multivibrator 196 and the normal output of the lower bistable multivibrator 198 are connected to an AND-gate 200, therefore, if an image of a gold reflection is present in both position marker zones simultaneously, a "gold in both zones" wire 202 is energized. conversely, the inverted outputs from both of the bistable multivibrators 196 and 198 are connected to an AND-gate 204. When an image of a reflective gold beam lead is present in neither of the position marker zones, a "gold in neither zone" wire 206 is energized.

It is desired to move the table in a direction so as to move the chip 100 (FIG. 2) in a downwardly direction whenever there is gold in both zones or whenever there is gold in just the upper zone. Therefore, the gold in both zones wire 202 and the normal output of the upper bistable multivibrator 196 carried on a "gold in upper zone" wire 208 are both connected to an OR-gate 210. The output of the OR-gate 210 passes through a normally energized AND-gate 212 to a "go down" wire 214 which delivers a signal to the control system of the positioning table to move the chip 100 down as viewed in FIG. 2. The go down wire 214 also extends to further circuitry which will be described hereinafter.

When there is gold in neither zone or when there is gold in only the lower zone, it is desired to move the chip 100 in an upward direction as viewed in FIG. 2. Therefore, the gold in neither zone wire 206 (FIG. 6) and a "gold in lower zone" wire 216, connected to the normal output of the lower bistable multivibrator 198, are connected to the inputs of an OR-gate 218, the output of which is connected through an inhibit gate 220 to a "go up" wire 222, which is also connected to the table control system so as to move the table in such a way as to cause the chip 100 (FIG. 2) to move in an upwardly direction.

A control input 224 of the inhibit gate 220 is connected to the go down wire 214 so as to prevent the issuance of conflicting instructions on the wires 214 and 222.

The position marker zones have finite size as do the beam leads of the chip and the pads of the bond site. Therefore, the coincidence that is sought between these reflective gold surfaces and the marker zones is the actual edge of the reflective gold and the edge of the zone. Therefore, what is sought is a system for sensing the transition, in either direction, between gold or no gold in a zone.

To accomplish this, the conditions of the outputs of the bistable multivibrators 196 and 198 are compared with their immediately previous condition. Therefore, the normal and inverted outputs from the upper and lower bistable multivibrators 196 and 198 are respectively connected to the set prime and reset prime inputs of an upper storage bistable multivibrator 228 and a lower storage bistable multivibrator 230. The storage bistable multivibrators accept a trigger pulse from the data-available wire 158 substantially delayed in a delay circuit 232, which then triggers the storage bistable multivibrators to accept a condition of the upper and lower bistable multivibrators 196 and 198 just prior to the time that a new condition is set into them by the data-available signal on the wire 158. Therefore, the storage bistable multivibrators 228 and 230 always contain the prior condition of their respective upper and lower bistable multivibrators 196 and 198.

To note any change in the signal condition from one cycle to the next, the normal output of the upper bistable multivibrator 196 and the inverted output of the upper storage bistable multivibrator 228 are connected to the inputs of a transition AND-gate 234. Conversely, the normal output of the upper storage bistable multivibrator 228 and the inverted output of the upper bistable multivibrator 196 are connected to the inputs of another transistion AND-gate 236. Therefore, whenever a change occurs in the coincidence condition in the upper position marker zone 104, either the transistion AND-gate 234 or the transistion AND-gate 236 is energized, and in turn energizes a transistion OR-gate 238 which immediately sets an upper retention bistable multivibrator 240, to its 1 state. Consequently, whenever the image of the edges of the beam lead 106 (FIG. 2) exactly abuts the edge of the upper position marker zone 104, the upper retention bistable multivibrator 240 is set to its 1 state and remains in its 1 state until such time as the system is reset after the chip 100 has been picked up by the bonding head 82 (FIG. 1).

A similar transition sensing system is used for the lower position marker zone 108 by connecting the normal output from the lower bistable multivibrator 198 and the inverted output of the lower storage bistable multivibrator 230 to transistion AND-gate 242. The normal output of the lower storage bistable multivibrator 230 and the inverted output of the lower bistable multivibrator 198 are both connected to the input of another transistion AND-gate 244. The outputs from the transistion AND-gates 242 and 244 are connected through a transistion OR-gate 246, a nominal delay 248 and through an inhibit gate 250 to the set input of a lower retention bistable multivibrator 252. The lower retention bistable multivibrator 252 is set to its 1 state whenever the image of the edge of the beam lead 110 (FIG. 2) exactly abuts the edge of the lower position marker zone 108. As in the case of the upper retention bistable multivibrator 240, the lower retention bistable multivibrator 252 remains in its 1 state until the entire system is reset.

When the chip 100 appears in the field of view of the TV camera and the fine positioning system begins operation, the most likely position of the chip 100 is somewhere between the position marker zones and generally as shown in FIG. 2. Therefore, neither of the zones 104 nor 108 will coincide with a reflective image of gold beam leads 106 or 110, respectively. However, it is possible, due to the positioning tolerances of the carrier 50, that either one or even both of the beam leads 106 or 110 might be positioned in coincidence with its associated position marker zone. If the chip 100 is badly skewed and rotated somewhat clockwise from the position shown in FIG. 2, both position markers 104 and 108 might coincide with a reflective gold image. Therefore, the logic system of FIG. 6 must be prepared to analyze and position the chip 100 under any one of these four possible conditions.

GOLD IN NEITHER ZONE

When the logic system of FIG. 6 turns ON and finds that both of the bistable multivibrators 196 and 198 are in the 0 state, the gold in neither zone wire 206 is energized. This energization signal passes through the OR-gate 218 and the inhibit gate 220 to the go up wire 222 which commands the positioning table to move the chip up, as viewed in FIG. 2. This same signal passes through a nominal delay 254 and provides one of inputs for an enable AND-gate 256.

As the chip 100 moves up in FIG. 2, the image of the gold beam lead 106 eventually touches the upper position marker zone 104, causing the upper retention bistable multivibrator 240 to be set to its 1 state. Before the nominal delay 254 can remove the energization from the AND-gate 256, the output of the upper retention bistable multivibrator 240 is sent on an "upper transistion sensed" wire 258 to the other input of the enable AND-gate 256 which thus sends an energization through an enable OR-gate 260 to the enable input of a counter 262. The counter 262 has a retentive input such that it remembers that it has been enabled and continues to be enabled until it is disabled. This retention feature is preferably supplied by a simple flip-flop or bistable multivibrator.

Since the upper position marker zone 104 is now sensing a coincide with gold, the upper bistable multivibration 196 is in its 1 state and the gold in upper zone wire 208 is energized. This sends an energization signal through the OR gate 210 and the normally-energized AND-gate 212 to the go down wire 214 which tells the mechanical positioning table to move the chip 100 in the down direction, as viewed in FIG. 2.

It will be evident that as soon as the positioning table begins moving the chip 100 down, gold will no longer coincide with the upper position marker zone 104. Therefore, the upper transition sensed wire 258 is connected to provide another input to the OR-gate 210 which assures that the OR-gate 210 will produce a go down signal any time that the upper transistion has been sensed.

As the chip 100 moves down in FIG. 2 one pulse is delivered to the counter 262 for each unit of movement of the positioning table in the down direction. Also, the go down signal on the go down wire 214, after passing through a nominal delay 264 sets a direction bistable multivibrator 266 to its 1 state to indicate that the table is now moving down.

The table continues to move down until the image of the gold beam lead 110 coincides with the lower position marker zone 108. At this time the lower retention bistable multivibrator 252 is set to its 1 state and provides an output on its normal terminal on a lower transition sensed wire 268 to provide one of the inputs to a stop AND-gate 270, the other input of which is provided by the go down wire 214. The output of the stop AND-gate 270 provides one input to another stop AND-gate 272, the other input of which is connected to the upper transistion sensed wire 258. Therefore, the stop AND-gate 272 provides an output to a stop OR-gate 274 to stop the counter 262. The output of the counter 262 is then divided by two in a divider circuit 276. The output of the divider circuit 267 indicates to the mechanical positioning table how far it is to move in order to center the chip 100 in the up and down direction (in FIG. 2) between the position marker zones 104 and 108. The direction bistable multivibrator 266 tells the mechanical positioning table control system which way the table should be moved. The output from the stop OR-gate 274 issues a "react" signal that triggers the table control system to initiate the table movement. Also, the output of the counter 262 is sent to a subtract circuit 278 which performs a subtraction operation using the contents of the counter 262 and the contents of the corresponding counter for the corresponding system of FIG. 6 associated with the left-right positioning of the chip 100. The output of the subtract circuit 278 is proportional to the rotational misalignment of the chip 100 and controls the $\theta$ table 60 to rotate the chip appropriately. Since the $\theta$ table 60, the mirror head 72, and the bonding head 82 are all coaxial, no X-Y misalignment is introduced by this $\theta$ correction.

GOLD IN BOTH ZONES

If the chip is aligned with the images of both of the beam leads 106 and 110 coincident with their respective position marker zones 104 and 108, both the upper and lower bistable multivibrator 196 and 198 are in their 1 state when the system of FIG. 6 is enabled. The AND-gate 200 then issues a signal on the gold in both zones wire 202 which passes through the OR-gate 210 and the normally energized AND-gate 212 to the go down wire 214. The signal on the go down wire 214 energizes the control input 224 of the inhibit gate 220.

Therefore, the signal present on the gold in the lower zone wire 216 from the normal of the lower bistable multivibrator 198 is blocked and cannot reach to go up wire 222. Therefore, the mechanical positioning table responds to the go down signal on the wire 214 and moves the chip 100 down as viewed in FIG. 2 until the image of the beam lead 106 just leaves the upper marker zone 104 and the upper retention bistable multivibrator 240 is set to its 1 state. The output of the nominal delay 264 is connected to one of the inputs of an enable AND-gate 280, the other input of the enable AND-gate 280 is connected to the inverted output of the lower retention bistable multivibrator 252. Therefore, since there has been no change at the lower transition marker zone, the AND-gate 280 provides an input to another enable AND-gate 282, the other input of which is the upper transition sensed wire 258. Therefore, when the upper retention bistable multivibrator 240 changes to its 1 state, as the beam lead 106 leaves the zone 104, the AND-gate 282 sends a signal through the enable OR-gate 260 to enable the counter 262.

At this time, it is desired that the chip now move up; because, the image of the beam lead 110 still coincides with the lower position marker zone 108. The gold in lower zone wire 216 is still energized and provides one of the inputs to an AND-gate 284. The normal output from the upper retention bistable multivibrator 240 is also connected to the AND-gate 284. When both of these inputs are present, the AND-gate 284 causes an inverter 286 to remove the normal energization from the AND-gate 212 and block the passage of signals to the go down wire 214. Therefore, the inhibit gate 220 no longer has a control signal at its control input 224; and the signal on the gold in the lower zone wire 216 can pass to the go up wire 222, which signals the table to go up, as viewed in FIG. 2.

As the positioning table moves the chip upward, the image of the beam lead 110 finally leaves the lower position marker zone 108 and the lower retention bistable multivibrator 252 changes to its 1 state and provides one of the inputs to a stop AND-gate 288. The other input of the stop AND-gate 288 is provided by the go up wire 222 through the nominal delay 254. Therefore, the stop AND-gate 288 provides one of the inputs to another stop AND-gate 290 whose second input is provided by the upper transition sensed wire 258. Therefore, the stop AND-gate 290 sends a disabling signal through the stop OR-gate 274 to stop the counter 262 and causes the mechanical positioning control system to react. The mechanical positioning control system then reacts to the output of the divide by two circuit 276 and the subtract circuit 278. The go up wire 222 is also connected to the reset input of the direction bistable multivibrator 266 which tells the positioning table circuit that the last movement of the positioning table was in the up direction and that correcting movement should now be in the down direction as viewed in FIG. 2.

GOLD IN UPPER ZONE

When the chip 100 is positioned with the image of its beam lead 106 coinciding with the upper position marker zone 104 and with the beam lead 110 positioned above the lower position marker zone 108, the gold in the upper zone wire 208 is energized and in turn, energizes the go down wire 214 to cause the positioning table to move the chip 100 in the down direction. Since the lower retention bistable multivibrator 252 is in its 0 state, its inverted output provides one of the inputs to the enable AND-gate 280 and the output of the nominal delay 264 provides the other input to the enable AND-gate 280 which then provides one input to the enable AND-gate 282.

If the image of the beam lead 110 enters the lower position marker zone 108 before the image of the beam lead 106 exits the upper position marker zone 104, it is desired to prevent the recognition of the edge transition between the image of the beam lead 110 and position marker zone 108. Therefore, the nominal delay 248 provides a very short delay of the set 1 signal to the lower retention bistable multivibrator 252. Since both upper and lower bistable multivibrators 196 and 198 are now in their 1 state, a signal is present on the gold in both zone wires 202 and provides an input to an inhibit AND-gate 292. Also, the upper transition has not yet been sensed and the upper retention bistable multivibrator 240 is still in its 0 state. Therefore, the inverted output from the upper retention bistable multivibrator 240 provides the other input of the inhibit AND-gate 292 which then energizes the inhibit gate 250 before the delay 248 can pass a signal to the set 1 input of the lower retention bistable multivibrator 252. From this point on, the system of FIG. 6 follows the procedure outlined above in connection with an initial condition of gold in both zones as described above.

However, if the image of the beam lead 110 does not engage the lower position marker zone 108 before the image of the beam lead 106 exits the upper position marker zone 104, the upper retention bistable multivibrator 240 is triggered to its 1 state when the image of the beam lead 106 does exit the upper position marker zone 104. The 1 signal thus applied to the upper transition sensed wire 258 provides the other input to the enable AND-gate 282 which energizes the enable OR-gate 260 to enable the counter. The 1 signal on the upper transition sensed wire 258 then passes through the OR-gate 210 and causes the energization of the go down wire 214 to continue. The continued signal on the go down wire 214 causes the positioning table to move the chip in the downward direction until the image of the beam lead 110 meets the lower position marker zone 108, at which point the lower retention bistable multivibrator 252 is set to its 1 state. The normal output of the lower retention bistable multivibrator 252 energizes the lower retention sensed wire 168 to cause the stop AND-gate 270 to issue an input to the stop AND-gate 272, the other input of which is provided by the upper retention sensed wire 258. This stops the counter 262 and initiates reaction of the mechanical positioning table.

GOLD IN LOWER ZONE

If the initial position of the chip 100 is such that the image of the beam lead 110 coincides with the lower position marker zone 108, and the image of the beam lead 106 does not coincide with the upper position marker zone 104, the lower bistable multivibrator 198 (FIG. 6) is in its 1 state and the upper bistable multivibrator 196 is in its 0 state. Only the gold in lower zone wire 216 is energized and energizes the go up wire 222 which causes the mechanical positioning table to move the chip 100 upwardly in FIG. 2. The go up wire 222, through the delay 254, provides one input to an enable AND-gate 294, the other input of which is provided by the inverted output of the upper retention bistable multivibrator 240. Therefore, so long as the upper positioning marker zone 104 does not see an edge of the image of the beam lead 106, the enable AND-gate 294 is energized and provides one input to another enable AND-gate 296. As the chip 100 moves up, the image of the beam lead 110 exits the lower position marker zone 108 and the lower retention bistable multivibrator 252 is energized and delivers a signal on the lower transition sensed wire 268 to provide the other input of the enable AND-gate 296. The enable AND-gate 296 then delivers a signal through the enable OR-gate 260 to start the counter 262.

However, if prior to the exit of the image of the beam lead 110 from the lower position marker zone 108, the image of the beam lead 106 enters the upper position marker 104, the upper bistable multivibrator 196 is set to its 1 state. The AND-gate 200 then issues an output on the gold in both zones wire 202. This causes the system of FIG. 6 to change to the case in which gold is found in both zones. Due to the delay 254, the energization from the go up wire 222 is still applied to the enable AND-gate 256 as well as the enable AND-gate 294. Therefore, when the upper retention bistable multivibrator 240 is set to its 1 state, the enable AND-gate 256 sends an enable signal through the enable OR-gate 260 to start the counter 262.

At this point, the normal output from the upper retention bistable multivibrator 240 also provides a second input to the AND-gate 284 which combines with the signal on the gold in lower zone wire 216 to cause the inverter 286 to remove the normal energization from the AND-gate 212. This precludes any go down signal on the go down wire 214. Also, when the upper retention bistable multivibrator 240 is in its 1 state, the inhibit AND-gate 292 is de-energized. Therefore, as the positioning table continues to move the chip 100 in the up direction, the lower retention bistable multivibrator 252 responds to the change as the image of the beam lead 110 exits from the lower position marker zone 108.

However, the most common case results in the image of the beam lead 110 exiting the lower position marker zone 108 prior to the time when the image of the beam lead 106 enters the upper position marker zone 104. Therefore, when the lower retention bistable multivibrator 252 assumes its 1 state prior to the upper retention bistable multivibrator 240, a signal on the lower transition sensed wire 268 provides the other input to the enable AND-gate 296. The enable AND-gate 296 sends an enable signal through the enable OR-gate 260 to start the counter 262, as described previously.

Since there is now gold in neither zone, the wire 206 is energized, continuing the energization of the go up wire 222. The go up wire 222, through the delay 254, provides one input to the stop AND-gate 288. The other input to the stop AND-gate 288 is provided by the lower transition sensed wire 268. consequently, as soon as the image of the beam lead 106 enters the upper position marker zone 104, the stop AND-gate 290 issues a stop pulse through the stop OR-gate 274 to stop the counter and cause the system to react.

STORED PROGRAM IMPLEMENTATION

If a stored program control device (digital computer) is readily available, it may be preferrable to implement the present invention in the form of a stored program. In FIG. 6 the positioning table was instructed to move in the direction and by the amount determined by simple binary circuits recognizing and remembering the coincidences of beam lead images and position marker zones in a particular sequence. This same process of sensing, remembering, and acting thereupon can just as readily be accomplished by a digital computer using a program derived from the simplified flow charge depicted in FIG. 7.

The entry of the program is to a decision as to whether or not this is the first cycle in the examination of the four position marker zones depicted in FIG. 2. If yes, the first operation is to initialize the registers of the stored program device. The second step is to read the data delivered to the store program control device (digital computer). The data to be read is the data available from the outputs of the circuit of FIG. 4, and comprises the binary states of the four bistable multivibrators 148 and the output from the data-available wire 158.

The next step in the program is to examine both position markers of one of the two axes, arbitrarily the Y-axis (up and down as viewed in FIG. 2) is chosen for purposes of explanation. The operation of the program is identical in the X-axis (right and left as viewed in FIG. 2). At this point, a decision is made as to whether there is gold in neither zone 104 or 108, gold in the upper zone 104, gold in the lower zone 108, or gold in both zones.

If there is gold in either zone, the program tests for which zone contains the gold. However, if there is gold in neither zone, the mechanical positioning table is instructed to move up along the Y-axis in FIG. 2, and after one increment of table movement again examines the data to seek gold in the zone 104. This loop is repeated until gold is located in zone 104 or until the program aborts after a predetermined number of cycles and requests a new chip.

Before the table is actually moved for each loop of the program, the computer is given an opportunity to process corresponding X-axis data. Therefore, after each movement command to the table, X-axis and Y-axis data are examined in turn. Each movement of the table is in response to a two-dimensional command and can be either up, down, or zero for the Y-axis plus right, left, or zero for the X-axis.

Once gold has been found in zone 104, the table is told to start moving down towards zone 108, and the computer counts the number (N) of increments of table movement necessary to get there. When gold is finally noted in zone 108, the number of increments is divided by two and the table is instructed to move up (towards zone 104) by a distance equal to the dividend (N/2). The $\theta$ rotational correction is then calculated using the corresponding X-axis dividend, and the program exits.

However, if, as mentioned above, gold is initially seen in either zone, the program tests for gold in zone 108. If no gold is found in zone 108, then gold is in zone 104 and the computer tells the table to move the chip down, testing for gold in zone 104 after each increment. After the gold leaves zone 104, zone 108 is examined. If there is still no gold in zone 108, the table continues moving down and the counter starts. The table moves down until gold is encountered in zone 108. The computer calculates and orders the corrections. However, if gold is in zone 108 after gold leaves the zone 104, the table moves up and counting is started. When gold leaves zone 108, the computer calculates and orders corrections.

It should be noted that if one axis finishes before the other axis, the first axis to finish waits for the other axis to finish before initiating the final mechanical correction steps. Both axes are needed for θ rotational correction.

Figure 7B:
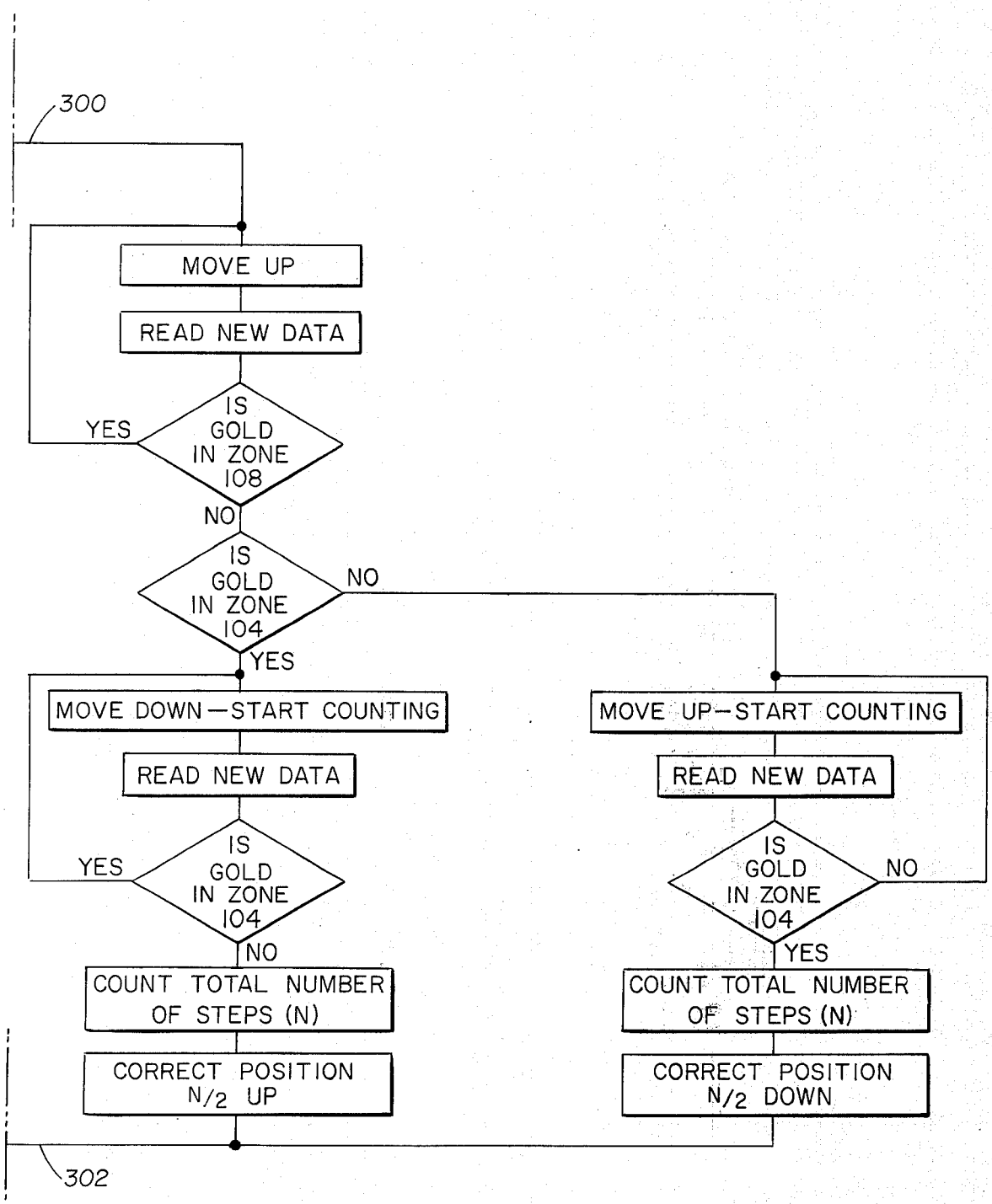

Returning now to another example, if there is initially gold in zone 108, the program proceeds on a branch 300 (to FIG. 7B). The table is told to move up until there is no gold in zone 108. Then zone 104 is tested. If there is gold in zone 104, the table is moved down while counting increments until there is no gold in zone 104. However, if the test of zone 104 finds no gold, the table moves up and the count is started until gold is found in zone 104. The counted is divided and the program returns on a branch 302 (to FIG. 7A).

Although a particular embodiment of the invention is shown in the drawings and has been described in the foregoing specification, it is to be understood that other modifications of this invention, caried to fit particular operating conditions will be apparent to those skilled in the art; and the invention is not to be considered limited to the embodiment chosen for purposes of disclosure, and covers all changes and modifications which do not constitute departures from the true scope of the invention.

What is claimed is:

1. A method of positioning an article having at least one prominent feature including generating first video signals representing the article including all prominent features which comprises;
    generating second video signals representing a first position marker;
    generating a third video signal representing a second position marker;
    moving the article in a direction to bring a prominent feature into a position wherein the first video signals of that prominent feature coincide with the second video signals of the first position marker;
    moving the article in a direction to bring a prominent feature into a position wherein the first video signals of that prominent feature coincide with the third video signals of the second position marker; and
    moving the article to a position midway between its positions at which coincidence was achieved with the first position marker and the second position marker.

2. A method of using a video camera having a video field scanned by a video raster, to position an integrated circuit having beam leads with edges, to locate precisely the integrated circuit for a manufacturing operation, comprising the steps of;
    moving the integrated circuit to a location within the optical field of the video camera;
    illuminating the integrated circuit from a plurality of directions to form reflections from its beam leads;
    generating a video signal representing the integrated circuit;
    defining a first area and a second area within the video raster;
    relatively moving the video signal and at least the first area in a first dimension to bring the image of an edge of a beam lead into coincidence with an edge of the first area;
    relatively moving the video signal and at least the second area in a first direction in the first dimension to bring the image of an edge of a beam lead into coincidence with an edge of the second area;
    measuring a first distance relatively moved by the video signal and the first and second areas in the first dimension between the coincidence of the image of an edge of a beam lead and the edge of the first area and the coincidence of the image of an edge of a beam lead and the edge of the second area; and
    moving the integrated circuit in the first dimension in a direction opposite to the first direction by a distance equal to one-half of the measured first distance.

3. A method according to claim 2 further comprising:
    generating a third and a fourth area within the video raster;
    relative moving the video signal and at least the third area in a second dimension orthogonal to the first dimension to bring the image of an edge of a beam lead into coincidence with an edge of the third area;
    relatively moving the video signal and at least the fourth area in a second direction in the second dimension to bring the image of an edge of a beam lead into coincidence with an edge of the fourth area;
    measuring a second distance relatively moved by the video signal and the third and fourth area in the second dimension between the coincidence of the image of an edge of a beam lead and an edge of the third area and the coincidence of the image of an edge of a beam lead and an edge of the fourth area; and
    moving the integrated circuit in the second dimension in a direction opposite to the second direction by distance equal to one-half of the measured second distance.

4. A method according to claim 3 which further comprising:
    generating a rotary correction signal in accordance with the difference between the first and second distances; and
    rotating the integrated signal by an amount representative of that correction signal.

5. A method of positioning an article having at least one prominent feature comprising:
    generating first video signals representing the article including all prominent features;
    generating second video signals representing a first pair of position markers;
    generating a third video signal representing a second pair of position markers;
    moving the article in a direction to bring a prominent feature into position wherein the first video signals of a prominent feature coincides with the second video signals of the first position markers;
    moving the article in a direction to bring a prominent feature into position wherein the first video signals of a prominent feature coincides with the third video signals of the second position markers;
    generating a locating signal indicative of one-half the distance that the article is moved between the coincidence with the first position markers and the coincidence with the second position markers; and
    moving the article in accordance with said locating signal to a position midway between the first position markers and the second position markers.

6. A system for positioning an article having at least one prominent feature including generating video signals representing the article including all prominent features which comprises:
- a first pair of position markers superimposed on the video signals;
- a second pair of position markers superimposed upon the video signals;
- means for moving the article and a prominent feature thereon into a position wherein the video signals of that prominent feature coincide with the first position markers;
- means for moving the article and a prominent feature thereon into a position wherein the video signals of that prominent feature coincide with the second position markers; and
- means for moving the article to a position midway between its positions at which coincidence was achieved with the first position markers and the second position marker.

7. In a system for orienting a device having four opposed sides and at least one lead extending orthogonally in X and Y directions from each side:
- means for movably supporting the device;
- means for electronically beam scanning a zone of the support means to produce video signals and a video display of the zone;
- means for impressing four reference marker signals into video signals to produce two pairs of reference marker images on the video display which are diametrically opposed with equal spacing between marker images in each pair;
- means for moving the support means to position the device and the leads within said scanned zone and with the image of each lead laterally spaced from one of the images of the reference markers;
- means for imparting reciprocating motion to the support in the X direction and in the Y direction;
- means responsive to each concidence of a reference marker signal with the video signal generated by the reflection of the beam from the edge of a lead for generating a motion reversing signal and then a motion terminating signal;
- means responsive to each motion reversing signal for reversing the movement of the support means in the X and Y directions;
- means for monitoring the movements of the support means and generating correction signals indicative of one-half the movements in the X and Y directions; and
- means responsive to the correction signals for reverse moving the support means a distance equal to one-half the distance travelled during each reverse reciprocation of the support means.

8. A method of using a video camera having a video field scanned by a video raster, to postion an article having prominent features with edges, to locate precisely the article for a manufacturing operation, comprising the steps of:
- moving the article to a location within the optical field of the video cameras;
- illuminating the article from a plurality of directions to form reflections from its prominent features;
- generating a video signal representing the article;
- defining a first area and a second area within the video raster;
- relatively moving the video signal and at least the first area in a first dimension to bring the image of and edge of a prominent feature into coincidence with an edge of the first area;
- relatively moving the video signal and at least the second area in a first direction in the first dimension to bring the image of an edge of a prominent feature into coincidence with an edge of the second area;
- measuring a first distance relatively moved by the video signal and the first and second areas in the first dimension between the coincidence of the image of an edge of a prominent feature and the edge of the first area and the coincidence of the image of an edge of a prominent feature and the edge of the second area; and
- moving the article in the first dimension in a direction opposite to the first direction by a distance equal to one-half of the measured first distance.

* * * * *